(12) United States Patent
Yoshida

(10) Patent No.: US 6,735,121 B2
(45) Date of Patent: *May 11, 2004

(54) NONVOLATILE MEMORY SYSTEM HAVING STATUS REGISTER FOR REWRITE CONTROL

(75) Inventor: Keiichi Yoshida, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/002,010

(22) Filed: Dec. 5, 2001

(65) Prior Publication Data

US 2002/0110023 A1 Aug. 15, 2002

(30) Foreign Application Priority Data

Dec. 11, 2000 (JP) ........................................ 2000-376170

(51) Int. Cl.$^7$ ............................................... G11C 16/06
(52) U.S. Cl. ............................ 365/185.22; 365/185.11; 365/185.33
(58) Field of Search ....................... 365/185.33, 185.29, 365/185.11, 185.22; 711/103, 163, 165; 714/718, 720

(56) References Cited

U.S. PATENT DOCUMENTS

| 5,056,009 | A | * | 10/1991 | Mizuta ........................ 711/163 |
| 5,402,380 | A | * | 3/1995 | Kumakura et al. ..... 365/185.08 |
| 5,469,394 | A | * | 11/1995 | Kumakura et al. ......... 365/201 |
| 5,959,882 | A |   | 9/1999 | Yoshida et al. ......... 365/185.03 |
| 5,991,197 | A | * | 11/1999 | Ogura et al. ............ 365/185.11 |
| 6,046,936 | A |   | 4/2000 | Tsujikawa et al. ...... 365/185.03 |
| 6,078,519 | A | * | 6/2000 | Kanamitsu et al. ..... 365/185.03 |
| 6,501,682 | B2 | * | 12/2002 | Yoshida ................. 365/185.22 |

* cited by examiner

Primary Examiner—Gene Auduong
(74) Attorney, Agent, or Firm—Miles & Stockbridge P.C.

(57) ABSTRACT

A status register within a non-volatile semiconductor memory device chip is provided with a bit indicating whether an access is possible from the external side of the chip or not and a controller for instructing the write process to the non-volatile semiconductor device issues again a write process instruction to the same area depending on the condition of the bit of the status register. Thereby, reduction of effective memory area due to an accidental write error generated can be prevented in the system utilizing an electrically erasable and programmable non-volatile semiconductor memory device such as a flash memory.

20 Claims, 12 Drawing Sheets

THRESHOLD VOLTAGE
DISTRIBUTION OF
MEMORY CELLS

THRESHOLD VOLTAGE
DISTRIBUTION OF
MEMORY CELLS

THRESHOLD VOLTAGE DISTRI-
BUTION OF MEMORY CELLS

THRESHOLD VOLTAGE DISTRI-
BUTION OF MEMORY CELLS

THRESHOLD VOLTAGE DISTRI-
BUTION OF MEMORY CELLS

THRESHOLD VOLTAGE DISTRI-
BUTION OF MEMORY CELLS

THRESHOLD VOLTAGE DISTRI-
BUTION OF MEMORY CELLS

NONVOLATILE MEMORY SYSTEM HAVING STATUS REGISTER FOR REWRITE CONTROL

BACKGROUND OF THE INVENTION

The present invention relates to a semiconductor memory technique and more specifically to a technique that may be effectively adapted to a system utilizing a non-volatile memory for electrically erasing and programming information and additionally to a technique that may be effectively adapted to a system using, for example, a flash memory.

The flash memory uses, as a memory cell, a non-volatile memory element consisting of a MOSFET of a double-layer gate structure including a control gate and a floating gate and is capable of changing a threshold voltage of the MOSFET to store information by changing a fixed amount of charges of the floating gate.

In this flash memory, change of threshold voltage due to the write and erase operation to the memory cell of course fluctuates among memory cells and also fluctuates for each operation even in the same memory cell and therefore the threshold voltage of the memory cell is distributed within a certain range after the write and erase operation. Moreover, in some memory cells, the threshold voltage of memory cell cannot be changed up to the desired level with a single cycle of the write and erase operations. Therefore, the flash memory often has a structure that a status register is generally provided therein and if write or erase operation is not successfully completed, such defective operation is stored as the write error or erase error.

In the side of CPU to give an instruction for write or erase operation to the flash memory, a sector including a memory cell which has generated an error is registered as a defective sector by referring to such status register and such sector is excluded thereafter from the effective memory area of data.

SUMMARY OF THE INVENTION

Although the threshold voltage cannot be changed up to the predetermined level in a certain memory cell which has generated an error even after the write and erase operations have been conducted many times, in many memory cells, the normal write operation can be realized by conducting the re-write operation after the erase operation is once conducted (hereinafter, such defective memory cell is called the accidentally defective memory cell). Particularly in a multi-level flash memory in which the data of 2-bits or more is stored in one memory cell, since the range of threshold voltage corresponding to each stored information is narrower than that of the binary memory cell, such accidental fault may be easily generated.

However, in the flash memory, the detail error condition of sectors including the bits having generated a write error has not been reflected on the status register. Therefore, the sectors having generated an error have all been registered as defective sectors and excluded from the effective memory area, and thereby the total memory capacity is reduced. Moreover, when a write error is generated, the alternative sector process to exchange such defective sector alternative sector is conducted. Therefore, a problem arises in which the time required for total write operation is extended.

It is an object of the present invention to provide a system utilizing an electrically erasable and programmable non-volatile semiconductor memory device, such as a flash memory, with a view toward preventing reduction of effective memory capacity due to an accidental write error and increasing the memory capacity for application as in the system.

It is another object of the present invention to provide a system utilizing an electrically erasable programmable non-volatile semiconductor memory device such as a flash memory, with a view toward reducing the number of times of the alternative sector process and reducing the time required for the total write operation.

The abovementioned and the other objects and novel features of the present invention will become apparent from description of this specification and the accompanying drawings.

Some principal aspects of the inventions disclosed in this specification can be summarized briefly as explained below.

In one aspect, there is provided, to a status register within a non-volatile semiconductor memory device chip, a bit indicating whether the normal write operation can be conducted by executing the write process again or not, and a controller for instructing the write process to such non-volatile semiconductor memory device issues an instruction to conduct again the write process to the same area depending on the bit condition of the status register.

In more detail, there is provided a memory system comprising a non-volatile semiconductor memory device, including a memory area including a plurality of non-volatile memory cells, a status register indicating the internal condition and an external terminal for outputting at least a part of the contents of the status register, and a controller for issuing an instruction to the non-volatile semiconductor memory device and conducting the process for the defective write process area. In this memory system, the status register is provided with a first bit to indicate whether the normal write process is possible or not by executing again the write process and the controller issues an instruction to conduct again the write process to the same area depending on the condition of the first bit.

According to the means explained above, a chance of normal write process increases, by reading the contents of the status register to conduct re-write process depending on the condition of bits, even in the memory cell which has once shown a fault and thereby reduction of effective memory capacity due to an accidental write error can be prevented.

The status register is preferably also provided with a second bit indicating whether the write process has been completed normally or not and the controller issues an instruction for re-write process depending on the condition of the first bit when the second bit indicates that the write process is not completed normally. Thereby, when the write process is completed normally, this write process can be completed immediately without checking the first bit which indicates possibility of normal write process by conducting again the write process.

The status register is preferably also provided with a third bit for indicating whether access from the external side of chip is possible or not and the controller issues an instruction, when the third bit indicates that access from external side is possible, to conduct again the write process depending on the condition of the first bit. Accordingly, whether the non-volatile semiconductor memory device is in the access-ready condition or not can be known accurately by reading the content of the status register.

Furthermore, the non-volatile semiconductor memory device is preferably provided with an external terminal for reflecting the condition of the third bit and the controller issues an instruction, when the signal at the external terminal indicates possibility of access from the external side, to conduct again the write process depending on the condition of the first bit. Accordingly, the controller can detect the end of write operation within the non-volatile semiconductor device without reading out the contents of the status register by monitoring the signal at the external terminal. Thereby, the total write operation period can be reduced by eliminating useless waiting time.

Moreover, the controller is also provided with a function to execute the process to replace the memory area in which the write process has not been completed normally with another memory area and therefore to execute, if the normal write process cannot be realized with the re-write process based on the condition of the first bit, the process to replace the memory area where the relevant normal write process has not been completed with the other memory area. Thereby, reduction of effective memory capacity due to an accidental write error can be reduced and the memory area where the normal write process cannot be realized even with the re-write process can be defined as a defective memory area and can be replaced with the other normal memory area.

In addition, the memory area where the normal write process is impossible may be replaced with another memory area in the case that the normal write process impossible even after the re-write process conducted on the basis of the first condition of the first bit and in the case that the second bit does not indicate the normal end of write process and the first bit is in the second condition. Thereby, an accidental write error and a non-accidental write error can be discriminated, the defective memory area can be replaced with the other normal memory area when a non-accidental write error is generated and the total write process period can be reduced.

When the memory area where the write process cannot be completed normally is replaced with the other normal memory area, the controller writes information indicating the defective memory area into a part of the memory area where the write process cannot be completed normally. Accordingly, read of erroneous information can be avoided and such information can be used for analysis of a fault.

In addition, at the time of replacing the memory area where the write process cannot be completed normally with the other memory area, the controller reads the information stored in the other memory area and then determines whether the relevant area is the defective memory area or not for the purpose of replacement of memory areas. Thereby, a useless write process can be eliminated, total write time can be shortened and useless power consumption can also be reduced.

Further, the controller executes the process to replace the relevant memory area with the other memory area if the write process cannot be completed normally even after the predetermined number of times of re-write process instructed depending on the condition of the first bit. Thereby, an endless loop in which the re-write operation is repeated upon erroneous determination of an accidental write error and abnormal extension of the time required for the write operation can be avoided.

Moreover, contents of the status register are read to the external terminal when a plurality of control signals supplied from the controller are combined as predetermined. Thereby, the controller can check the contents of the status register with a simplified process based on an output of the control signals.

A second principal aspect of the invention relates to a data processing system comprising a non-volatile semiconductor memory device including a memory area having a plurality of non-volatile memory cells, a status register indicating the internal condition and an external terminal for outputting at least a part of contents of the status register, and a controller for making access to such non-volatile semiconductor memory device, wherein the status register is provided with a first bit indicating whether the write process can be completed normally by executing again the write process, and the controller issues an instruction to conduct the write process again to the same area depending on the condition of the first bit.

According to the means explained above, a chance of normal write process even in the memory area where a fault is once generated can be increased when the controller reads the contents of the status register to issue an instruction for re-write process depending on the condition of the bit. Thereby, a reduction of effective memory capacity of the system due to an accidental write error can be prevented.

A third principal aspect of the invention relates to a data processing system comprising a non-volatile semiconductor memory circuit including a memory area having a plurality of non-volatile memory cells, a status register indicating the internal conditions and a terminal for outputting at least a part of contents of the status register, a memory device including a control circuit for issuing an instruction of write process to the non-volatile semiconductor memory circuit and conducting the process to the defective write area and a data processing device for making access to the memory device, wherein the status register is provided with a first bit indicating whether the write process can be completed normally by executing again the write process, and the control circuit issues an instruction to conduct again the write process to the same area depending on the condition of the first bit.

According to this means, a chance of normal write process even in the memory area where a fault is once generated can be increased when the control circuit reads the contents of status register and executes again the write process depending on the condition of the bit. Thereby, reduction of effective memory capacity of the system due to an accidental write error can be prevented and the share of data processing device can also be reduced.

DETAILED DESCRIPTION OF THE PREFERRED EMBODIMENTS

The preferred embodiments of the present invention will be explained with reference to the accompanying drawings.

Figure 1:
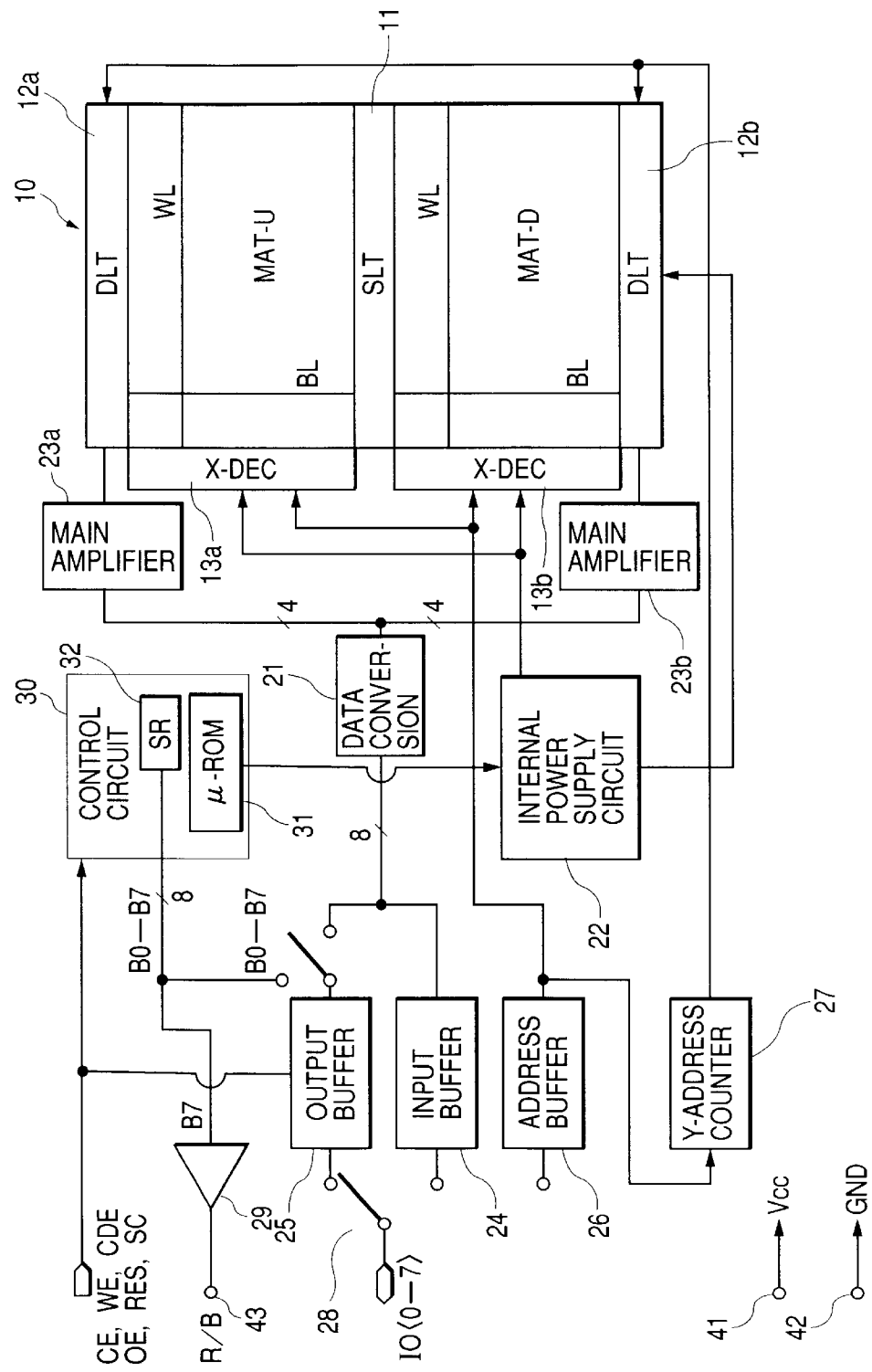
FIG. 1 a block diagram showing an example of a flash memory as a non-volatile semiconductor memory device used the memory system of the present invention.

FIG. 1 is a block diagram of an example of a flash memory as a non-volatile semiconductor memory device used as a memory system of the present invention. Although not particularly restricted, a flash memory of FIG. 1 is structured as a multi-level memory which can store the data of 2-bits into only one memory cell and is formed on one semiconductor chip such as a single crystal silicon. The flash memory of FIG. 1 is characterized in that if an accidental fault is generated upon the write operation, it is reflected in direct to a status register. A structure of the flash memory of the embodiment including such structure will be explained below.

In the flash memory of FIG. 1, although not particularly restricted, a memory array is structured with a plurality of mats, and a sense & latch circuit (hereinafter referred to as a sense latch abbreviated as SLT) which is connected to the bit line BL within each mat to amplify and latch a read signal is allocated between two mats. Moreover, a latch circuit for temporarily holding the write and read data respectively is allocated at the external side of each mat, namely at the opposite side of the sense & latch circuit SLT in regard to the bit line BL. Hereinafter, this latch circuit is called the data latch abbreviated as DLT.

In FIG. 1, the reference numeral 10 designates a memory array structured with two memory mats MAT-U, M.AT-D; numeral 11, a sense & latch circuit (hereinafter referred to as sense latch abbreviated as SLT) allocated between the memory mats MAT-U, MAT-D. In the memory mats MAT-U, MAT-D, the memory cells, each of which is structured with a MOSFET of the double-gate structure including a floating gate and a control gate, are allocated respectively in the form of a matrix and the control gates of the memory cells of the same row are continuously formed to form the word lines WL, while the drains of the memory cells of the same column can be connected to the common bit line BL.

In the memory array 10, the X-system address decoders (word decoders) 13a, 13b are provided respectively corresponding to each memory mat MAT-U, MAT-D. These decoders 13a, 13b respectively include a word drive circuit for driving one word line WL within each memory mat to the selection level depending on the decoding result.

The numeral 21 is a data conversion circuit for converting an externally inputted write data to the 4-level data (3 bits) in every two bits when the information is stored by converting the 4-level, namely the threshold voltage of memory cell in the four stages. The data latch circuits (DLT) 12a, 12b for holding the write data converted with the data conversion circuit 21 and the read data from the memory cell are respectively allocated in the external side (in the vertical direction in the figure) of the memory mats. In the case of storing the 4-level data, the write data of 2 bits converted with the data conversion circuit 20 is shared and held in the data latch circuits 12a, 12b and sense latch circuit (STL) 11. During the read operation, the data read from the memory cells is held in the data latch circuits 12a, 12b and sense latch 11 and calculated logically for the inverse conversion to the data of 2 bits.

The address decoder circuit of Y-system and a column switch which is turned ON and OFF selectively with this decoder to transfer the data from the data conversion circuit 21 to the corresponding sense latch are structured integrally with the data latch circuits 12a, 12b. In FIG. 1, the decoder circuit of Y-system, column switch and data latch circuit are indicated with only one function block (DLT).

The flash memory of FIG. 1 is provided, although not particularly restricted, with a control circuit (sequencer) 30 which interprets a command (instruction) given from an external controller and sequentially forms and outputs a control signal for each circuit within the memory for executing the process corresponding to the relevant command and is structured to automatically execute the corresponding process by decoding the given command. The control circuit 30 is provided, for example, with a ROM (Read Only Memory) 31 storing a series of micro-instruction groups required for execution of the command and is structured to form a control signal for each circuit in the chip through sequential execution of the micro-instructions. Moreover, the control circuit 30 is provided with a status register 32 reflecting the internal condition.

The multi-level flash memory of FIG. 1 additionally comprises an internal power supply circuit 22 for generating a high voltage to be used for write or erase process, main amplifier circuits 23a, 23b for amplifying the signals read from the memory array 10, an input buffer circuit 24 for fetching the write data signal and command inputted from external circuits, an output buffer circuit 25 for outputting the data signal read from the memory array and content of the status register 32 to the external circuits, an address buffer circuit 26 for fetching the address signal inputted from the external circuits, and an address counter 27 for counting up the input address signal fetched to generate the Y-system address or the like. The input buffer circuit 24, output buffer circuit 25 and address buffer circuit 26 are connected to the common input/output terminals I/O0 to I/O7 via a change-over switch 28 to input/output the data, command and address signal on the time division basis.

The internal power supply circuit 22 is composed of a reference power source generation circuit for generating the reference voltages such as the write voltage or the like, an internal power source generation circuit for generating the voltages required within the chip such as the verify voltage or the like, a power supply change-over circuit for selecting the desired voltage from these voltages depending on the operating condition of the memory and then supplying such voltage to the word decoders 13a, 13b or the like and a power supply control circuit for controlling these circuits or the like. In FIG. 1, numeral 41 designates a power supply voltage terminal to which the power supply voltage Vcc is applied from the external circuit and 42 designates a power supply voltage terminal (ground terminal) to which the ground potential Vss is applied.

The control signals inputted to the flash memory from an external controller include, for example, a reset signal RES, a chip selection signal CE, a write control signal WE, an output control signal OE, a command enable signal CDE for indicating the command, data input or address input and a system clock SC or the like. The command and address are fetched to the input buffer circuit 25 and address buffer circuit 27 depending on the command enable signal CDE and write control signal WE, while the write data is fetched to the input buffer circuit 25 in synchronization with the system clock SC input when it is inputted while the command enable signal CDE indicates the command or data input. Moreover, the flash memory is provided with an output buffer 29 for outputting, to the external terminal 43, the ready/busy signal R/B which indicates whether the access from the external circuit is possible or not, depending on the predetermined bit of the status register 32 reflecting the internal condition of memory.

Figure 2:
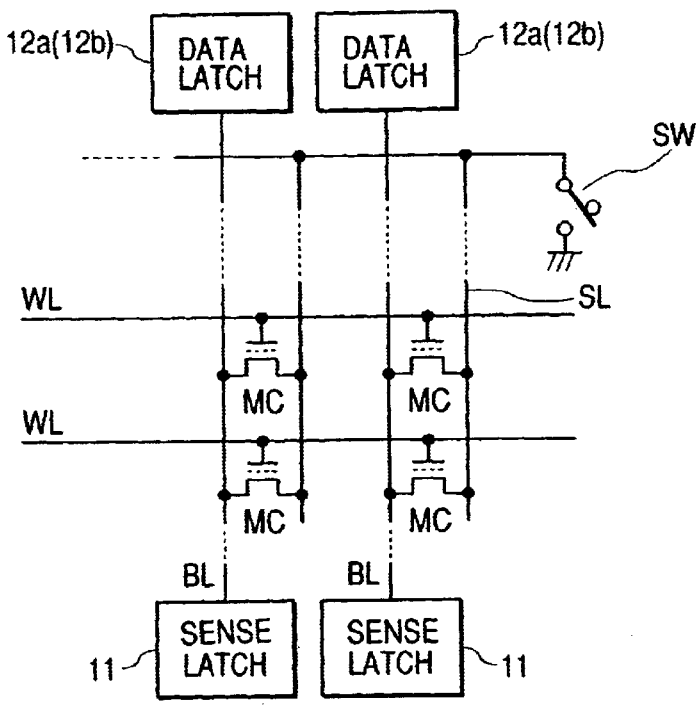
FIG. 2 is a circuit configuration diagram showing a schematic structure of a memory array in a flash memory of a preferred embodiment.

FIG. 2 shows a schematic structure of the memory array 10 of flash memory. Within the memory array 10, a plurality of memory cells MC are arranged in the form of a matrix, the word line WL connected with the control gates of the memory cells of the same row and the bit line BL connected with the drains of the memory cells of the same column are allocated crossing with each other and the source of each memory cell is connected to the common source line SL which gives the ground potential. The source line SL is provided with a switch SW and thereby the source of memory cell can be opened during the write process.

One end of each bit line BL is connected with the sense latch circuit 11 having the sense amplifier function to amplify the potential of the bit line and the data holding function, while the other end of each bit line is connected with the data latch circuit 12a (12b) having the data holding function. This data latch circuit 12a (12b) is used to hold the data for changing, step by step, the threshold voltage of the selected memory cells for operation as the multi-level memory.

Moreover, the sense latch circuit 11 and data latch circuit 12a (12b) are provided with a means for discharging a switch element for electrically connecting and disconnecting the corresponding bit line and the bit line. The sense latch circuit 11 may be provided with an inversion circuit for inverting the logic of the data on the bit line. In the case of 4-level data, since such switch element and inversion circuit are provided, data conversion to the 2-bit data can be realized within the memory array by conducting the wired arithmetic operation on the bit line among the data read from the memory cells by changing the read level.

Figure 3A:
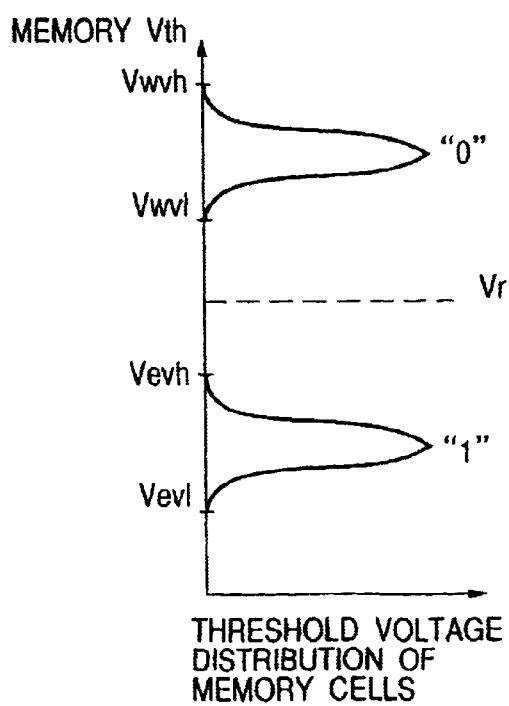
FIGS. 3(a) and 3(b) are explanatory diagrams showing distribution of the threshold voltages for storing 2-level data and 4-level data into the memory cell.
Figure 3B:
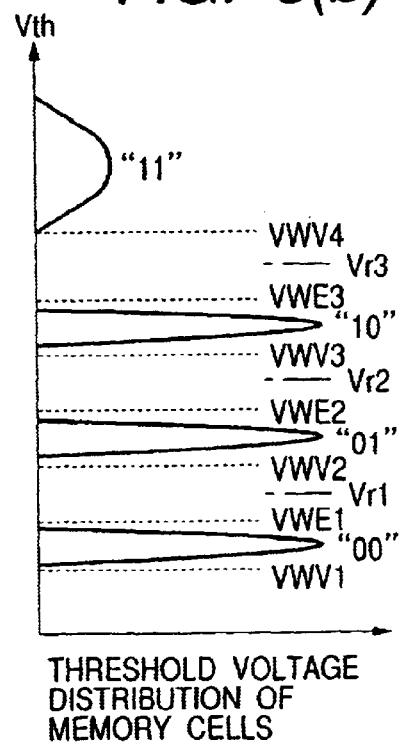

Although not particularly restricted, the flash memory is structured to store the binary data or 4-level data. FIGS. 3(a) and 3(b) show the distribution profiles of the threshold voltages for storing the binary data and 4-level data, respectively, to the memory cells. In the case of storing the binary data, the verify voltages Vwvh and Vwvl are set so that the threshold voltage of the memory cells corresponding to the stored data "1" is set within the range, for example, of 4.3V ±0.7V. Moreover, the verify voltages Vevh, Vevl are set so that the threshold voltage of the memory cells corresponding to the stored data "0" is set within the range, for example, of 1.5V ±0.7V. The read voltage Vr is set to the level of intermediate voltage of 2.9V.

In the case of storing the 4-level data, the write verify voltage Vwv4 is set so that the threshold voltage of the memory cells corresponding to the stored data "11" is set, for example, to 4.8V or higher. Moreover, the write verify voltages VWE3, VWV3, VWE2, VWV2, VWV1 are set so that the threshold voltage of the memory cells corresponding to the stored data "10" is set, for example, to 3.6V±0.4V, the threshold voltage of memory cells corresponding to the stored data "01" is set, for example to 2.2V±0.4V, and the threshold voltage of the memory cells corresponding to the stored data "00" is set, for example, to 1.0V±0.4V. In addition, the 4-level data read voltages Vr1, Vr2, Vr3 are respectively set to the levels of 1.5V, 2.9V, 3.8V.

Although not particularly restricted, in the flash memory, a positive high voltage (for example, +16V) is applied to the word line WL (control gate) at the time of write operation and the negative charges are then implanted to the floating gate of memory cell by utilizing the FN tunnel phenomenon for raising the threshold voltage thereof. Therefore, the bit line BL connected with the memory cells (for example, data "1") which are requested to raise the threshold voltage is not precharged, namely set to 0V, depending on the write data. Meanwhile, the bit line BL connected with the memory (for example, data "0") which are not requested to raise the threshold voltage is precharged to 5.5V. On the occasion of the write process, the source of each selected memory cell is floated (opened). During the data erase process, a negative high voltage (for example, −16V) is applied to the word line WL (control gate) and the potential 0V is applied to the bit line BL and source SL. Thereby, the negative charges are pulled from the floating gate of memory cell with the FN tunnel phenomenon in order to lower the threshold voltage.

Table 1 shows a structure example of the status register 32 in the flash memory.

TABLE 1

| | Definition | "0" | "1" |
|---|---|---|---|
| B7 | Ready/Busy | Busy | Ready |
| B6 | Retry Check | — | Retry |
| B5 | Erase Check | Pass | Fail |
| B4 | Program Check | Pass | Fail |
| B3 | Reserved | — | — |
| B2 | Reserved | — | — |
| B1 | Reserved | — | — |
| B0 | Reserved | — | — |

As shown in the Table 1, the status register 32 is formed of 8 bits of the bit B7 to bit B0. Among these bits, the bit B7 indicates the internal control condition of the chip (hereinafter referred to as R/B bit), the bit B6 indicates whether the re-write process has been conducted or not (hereinafter called the retry check bit), the bit B5 indicates the result of erase (hereinafter called the erase check bit), the bit B4 indicates the result of write process (hereinafter called the write check bit) and the bit B3 to bit B0 are spare bits.

In more detail, when the bit B7 is logic "0", it means that the chip is in the operating condition and external access is disabled and when the bit B7 is "1", it means that the chip is in the waiting condition and the external access is possible. Moreover, when the bit B6 is logic "0", it means that the re-write process has been not conducted and when the bit B6 is "1", it means that the re-write process has been conducted. Moreover, when the bit B5 is logic "0", it means that the erase process has been completed normally and when the bit B5 is "1", it means that the erase process has not been completed normally. Moreover, when the bit B4 is logic "0", it means that the write process has been completed normally and when the bit B4 is "1", it means that the write process has not been completed normally.

Figure 4:
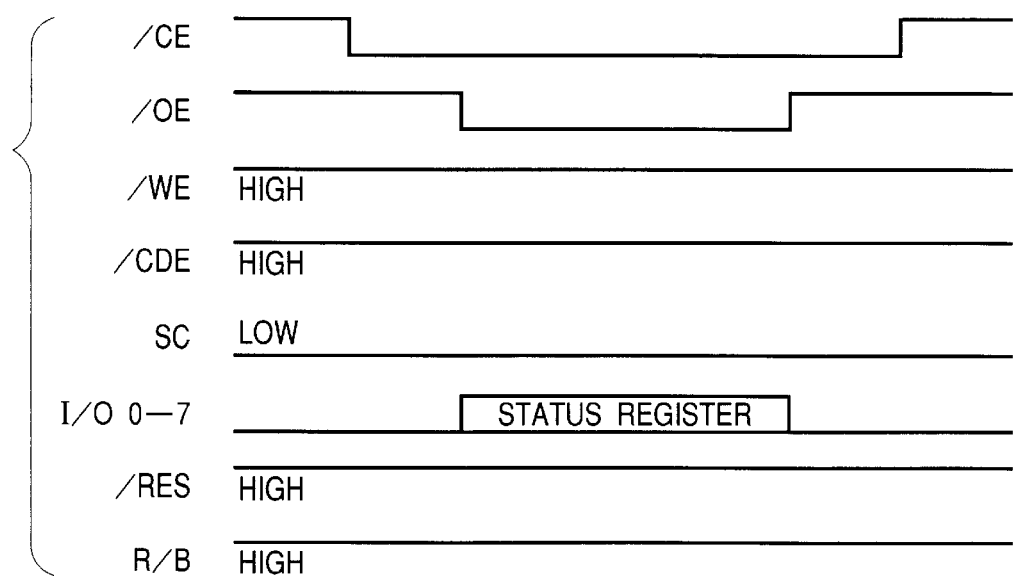
FIG. 4 is a timing chart showing an output timing of an output of the status register in the flash memory of FIG. 1.

Condition of the R/B bit B7 among the bits B7 to B0 of the status register 32 is always outputted to the external terminal 43 with the buffer 29 and when the externally supplied chip enable signal/CE and out enable signal/OE are asserted to the low level, for example, as shown in FIG. 4, all conditions of the bits B7 to B0 are outputted from the input/output terminals I/O7 to I/O0. Moreover, each bit B7 to B0 of the status register 32 is set sequentially with the control circuit 30 depending on each control condition. Next, the practical setting sequence of each bit of B7 to B0 of the status register 32 in the write process will be explained with reference to FIG. 5.

Figure 5:
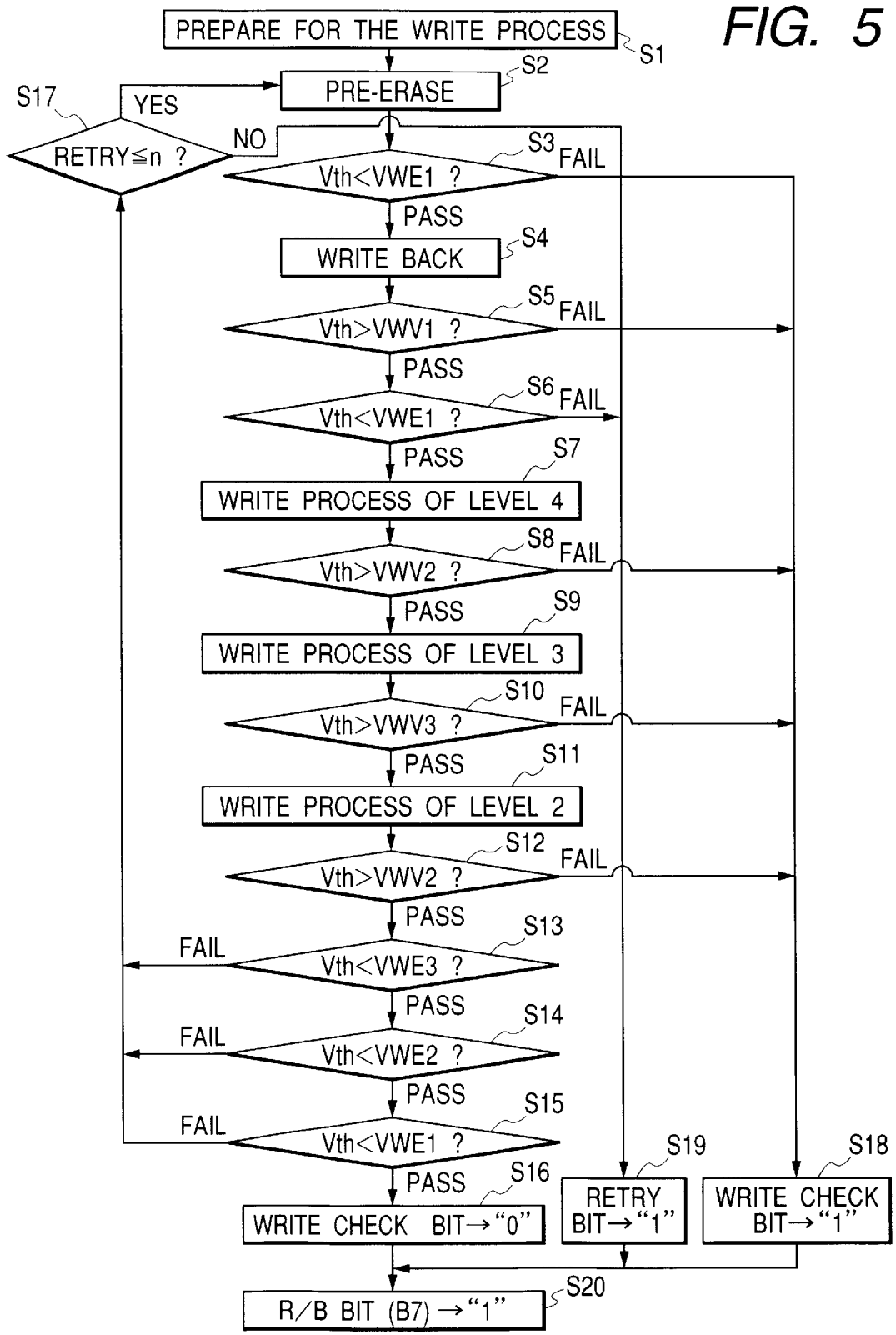
FIG. 5 is a flowchart showing the write process in the flash memory of the preferred embodiment and showing the practical setting sequence of each bit of the status register.
Figure 6A:
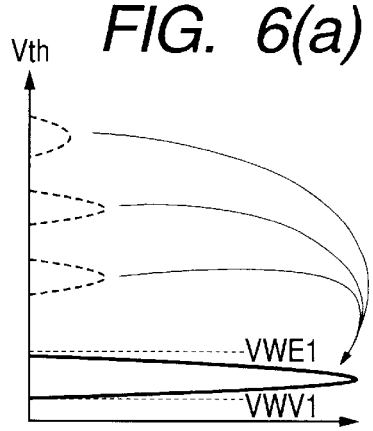
FIGS. 6(a), 6(b), 6(c), 6(d) and 6(e) are explanatory diagrams showing relationships between changes of memory cell threshold voltage and the verify voltages in the write process following the flowchart of FIG. 5.

The flowchart of FIG. 5 is started when the write command is inputted to the flash memory from an external controller. The control circuit 30 executes, upon recognition of the write command by decoding the command inputted, the preparation process such as the fetch of write address and write data or the like (step S1). Thereafter, the control circuit 30 once sets all memory cells of the sector as the write process object (hereinafter referred to as selected sector) to the erase condition as shown in FIG. 6(a) (condition where the threshold voltage is lowest corresponding to the data "00") (step S2). Setting of the logic "0" of the R/B bit B7 of the status register 32 is conducted in the preparation for the write process of the step S1.

Next, it is determined whether the threshold voltages vth of all memory cells in the selected sector are lower than the erase verify voltage VWE1 or not (step S3). When any one of the memory cells has the threshold voltages Vth which is higher than VWE1, the process jumps to the step S18 to set the write check bit to the logic "1" and moreover the R/B bit B7 is set to the logic "1" in the step S20 to complete the write process.

On the other hand, when it is determined that the threshold voltages Vth of all memory cells are lower than VWE1 in the step S3, the process shifts to the step S4 to raise the threshold voltage of the memory cells having the excessively lowered threshold voltage by conducting the weak write process. Next, it is determined whether the threshold voltages Vth of all memory cells in the selected sector are higher than the write verify voltage VWV1 or not (step S5). If any one of memory cells has the threshold voltage lower than VWV1, the process jumps to the step S18 to set the check bit to logic "1" and moreover the R/B bit B7 is set to the logic "1" in the step S20 to complete the write process.

When it is determined in the step 5 that the threshold voltages Vth of all memory cells are higher than the verify voltage VWV1, the process shifts to the step S6 and it is also determined again that the threshold voltages Vth of all memory cells are lower than the erase verify voltage VWE1 or not. When any one of memory cells has the threshold voltage lower than VWV1, the process jumps to the step S18 to set the write check bit to the logic "1" and moreover the R/B bit B7 is set to the logic "1" in the step S20 to complete the write process.

Figure 6D:
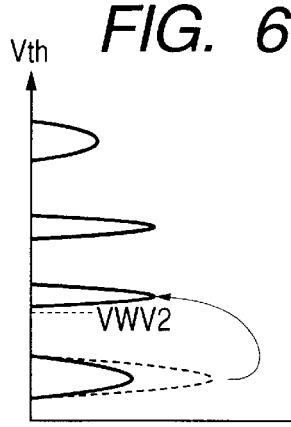
Figure 6B:
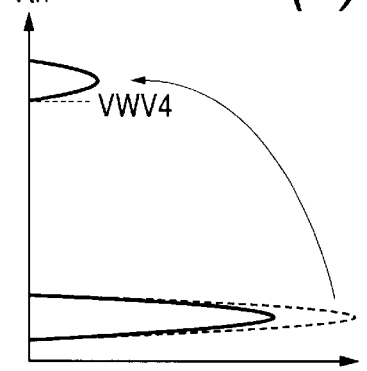
Figure 6E:
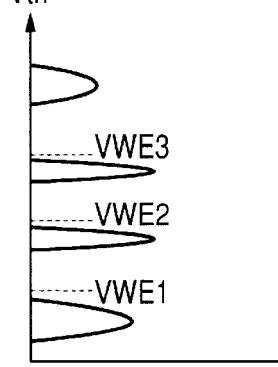

Meanwhile, when it is determined in the step S6 that the threshold voltages Vth of all memory cells are lower than VWE1, the process shifts to the step S7 to conduct the write process (called the write of level 4) for the memory cells to which the data "11" is written as shown in FIG. 6(b), namely the memory cells which are requested to have the highest threshold voltage. This selective write process is possible by precharging the bit line connected with the memory cells which are requested to raise the threshold voltage and then applying a high voltage to the selected word line after precharging the bit line connected with the memory cells which are not requested to raise the threshold voltage to the potential such as 5.5V. Thereafter, it is determined whether the threshold voltages Vth of all memory cells in the selected sector are higher than the write verify voltage VWV4 or not (step S8). If any one of the memory cells has the threshold voltage lower than VWV4, the process jumps to the step S18 and the write check bit is set to the logic "1" and moreover the R/B bit B7 is set to the logic "1" in the step S20 to complete the write process.

Figure 6C:
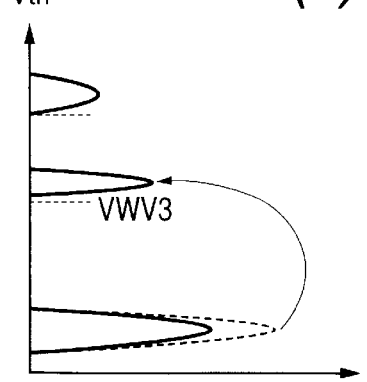

When it is determined that the threshold voltages Vth of all memory cells are higher than VWE4 in the step S8, the process shifts to the step S9 and the write process for the memory cells to which the dada "10" is written as shown in FIG. 6(c), namely for the memory cells which are requested to raise the threshold voltage to the second highest value (called the write process of the level 3) is conducted. Thereafter, it is determined whether the threshold voltages Vth of all memory cells in the selected sector are higher than the write verify voltage VWV3 or not (step S10). If any one of the memory cells has the threshold voltage higher than VWV3, the process jumps to the step S18 to set the write check bit to the logic "1" and the R/B bit B7 is set to the logic "1" in the step S20 to complete the write process.

When it is determined in the step S10 that the threshold voltages Vth of all memory cells are higher than VWE3, the process shifts to the step S11 and the write process for the memory cells to which the data "01" is written as shown in FIG. 6(d), namely the memory cells requested to raise the threshold voltage to the third highest value (called the write process of the level 2) is executed. Thereafter, it is determined whether the threshold voltages Vth of all memory cells in the selected sector are higher than the write verify voltage VWV2 or not (step S12). If any one of the memory cells has the threshold voltage lower than VWV2, the process jumps to the step S18 to set the write check bit B4 to the logic "1" and the R/B bit B7 is set to the logic "1" in the step S20 to complete the write process.

When it is determined in the step 512 that the threshold voltages Vth of all memory cells are higher than VWV2, the process shifts to the steps S13 to S15 to determine whether the threshold voltages of memory cells to which the write process of the level 3 is executed are lower than the verify voltage VWE3 or not, whether the threshold voltages of the memory cells to which the write process of the level 2 is executed are lower than VWE2 or not, whether the threshold voltages of the memory cells to which the write process is not conducted are lower than the verify voltage VWE1 or not, respectively. Such determination is possible by executing the read operation after precharging the bit line using the write data held in the data latch circuit.

When all verify voltages are satisfied in the determination of the steps S13 to S15, the process shifts to the step S16 to set the write check bit to "0" and thereafter the R/B bit B7 is set to the logic "1" in the step S20 to complete the write process. Meanwhile, if any one of memory cells does not satisfy the verify voltage in the determination of steps S13 to S15, the process jumps to the step S17 to determine whether the number of times of the write process is "n" or less (n is 0 or a positive integer and is generally set to "1"). When the number of times of write process is "n" or less, the process returns to the step S2 to repeat the above operation for the re-write operation (retry). Moreover, even after the re-try is conducted, if any one of memory cells does not satisfy the verify voltage with the determination in the steps S13 to S15, the process jumps to the step S19 from the step S17, the retry check bit B6 is set to the logic "1" and the R/B bit B7 is set to the logic "1" in the step S20 to complete the write process. It is also possible here that the retry check bit B6 is set to the logic "1" without conducting the retry process by setting "n" to "0".

Figure 7:
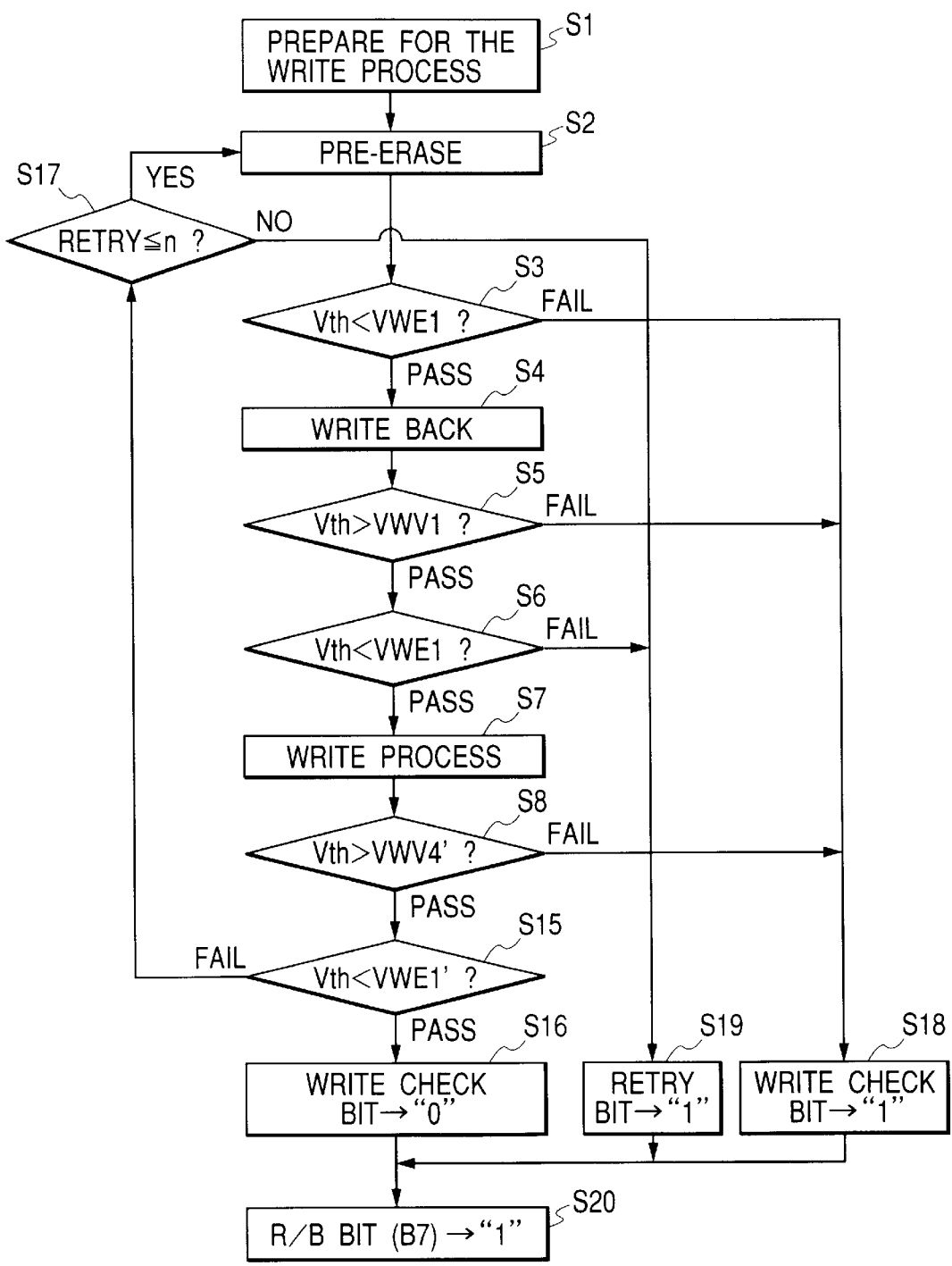
FIG. 7 is a flowchart of the write process and a practical setting sequence of each bit of the status register in the write process of 2-level data in the flash memory of FIG. 1.

FIG. 7 shows a sequence for writing the usual binary data in place of the 4-level data to the memory array of the flash memory of FIG. 1. In this case, each bit B7 to B0 of the status register 32 means the same contents as that explained above as shown in the Table 1.

Difference between the flowcharts of FIG. 7 and FIG. 5 is that the steps S9 to S14 in the flowchart of FIG. 5 are omitted in the flowchart of FIG. 7 and the verify voltage VWV4' in the step S8 and the verify voltage VWE1' in the step S15 are rather loosened in comparison with the in the flowchart of FIG. 5 in which the multi-level data is used (VWV4<VWV4', VWE1<VWE1').

As explained above, the flash memory is provided with a retry check bit B6 in the status register 32 and condition of this bit can be known from the external side. Therefore, the sector which has been excluded from the effective memory area through the registration as the defective sector can be used effectively by giving again the write command, address and data for the purpose of re-write process when the external controller reads the retry check bit B6 having the level "1" to indicate the retry condition.

It is known from experience that a fault which is determined with determination for the lower limit (Vth>VWV) of the distribution of threshold voltages in the verify operation after the write process is often assumed as the fault having reproducibility in the flash memory introducing the write and erase systems as explained above, but a fault which is determined with determination for the upper limit (Vth<VWE) of the distribution of threshold voltages in the verify operation after the write process is often assumed as an accidental fault having no reproducibility. In this case, since "1" is set to the retry check bit B6 in the embodiment explained above, when the bit B6 indicates the retry condition even if a write error is generated, an error can be eliminated by conducting again the write process and the probability for completion of write process can be also be raised. Therefore, such pseudo defective sector is not defined as a defective sector and can be treated as the a good sector and thereby the effective memory capacity can be enlarged.

Figure 8:
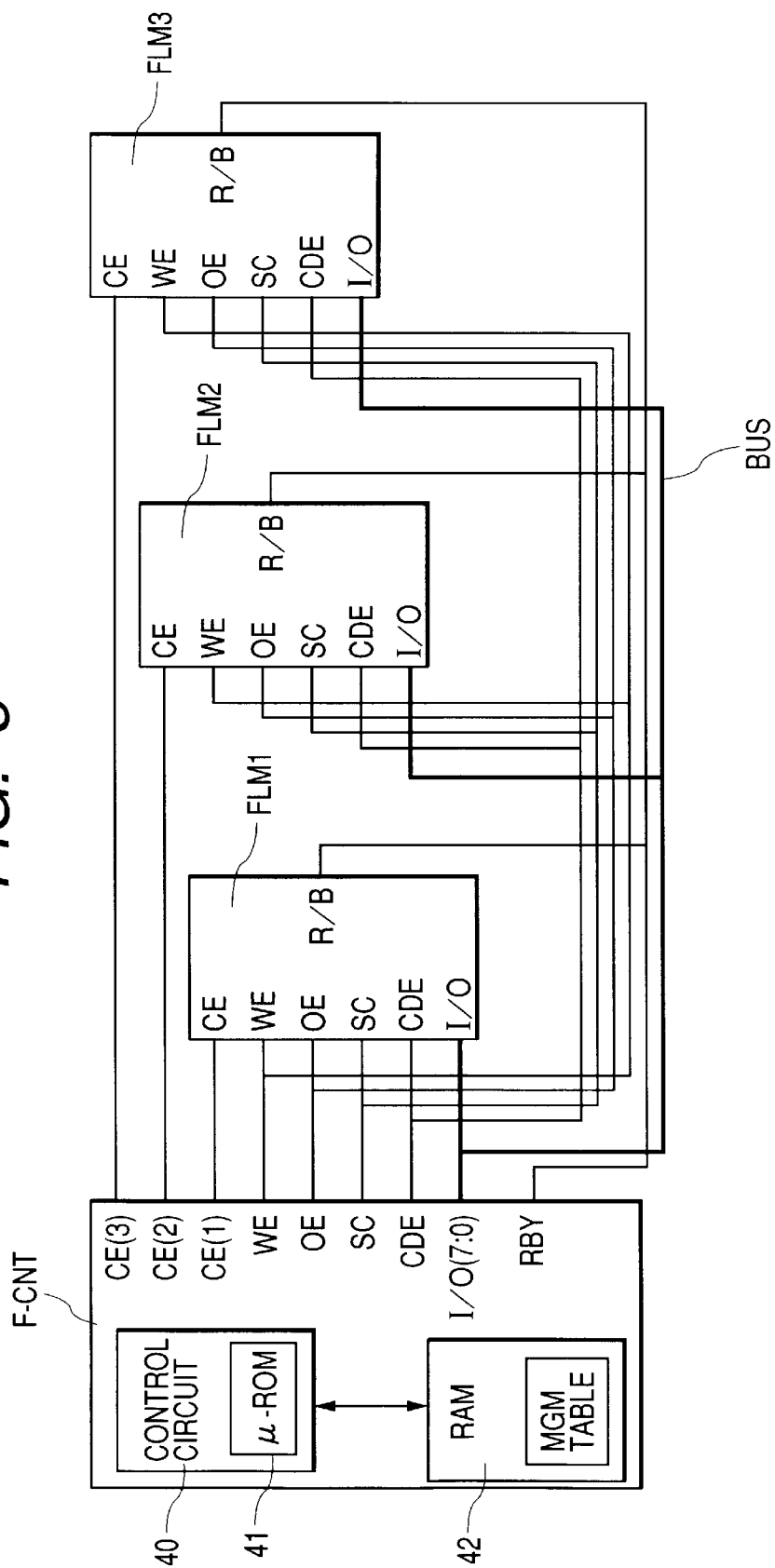
FIG. 8 is a block diagram showing a preferred embodiment of the memory system of the present invention using the flash memory of FIG. 1.

FIG. 8 shows an embodiment of the memory system using the flash memory explained above.

The system of this embodiment, although not particularly restricted, is composed of three flash memories FLM1, FLM2, FLM3 and a flash controller F-CNT for controlling the write and read operations for these flash memories. The system is therefore controlled with a chip enable signal CE, a write enable signal WE, an out enable signal OE and a command enable signal CDE outputted from the flash controller F-CNT and is connected for enabling data transmission and reception through a bus BUS.

Moreover, a clock signal SC for synchronization is also supplied to the flash memories FLM1, FLM2, FLM3 from the flash controller F-CNT. In addition, the flash controller F-CNT is connected the host CPU for communications. As the system explained above, a memory card like a compact flash, for example, may be contemplated. However, the system using the flash memory is not limited to the example of FIG. 8 and may be an electronic device such as a hand-held telephone set in which only one flash memory is mounted in the one to one (1:1) relationship with the CPU.

The flash controller F-CNT is provided with a control circuit (sequencer) 40 which interprets instructions given from the host CPU and sequentially forms control signals for the flash memory to execute the processes corresponding to such instructions and is structured to automatically execute, when an instruction is issued, the process by decoding such instruction. The control circuit 40 is also provided with a ROM (Read Only Memory) 41 storing, for example, a series of micro-instructions required for execution of the commands and is structured to form control signals for each circuit within the chip through sequential execution of the micro-instructions. Moreover, the flash controller F-CNT is also provided with a RAM 42 in which a table for management of defective sectors (hereinafter referred to as the MGM table) is stored.

Next, the write operation procedures utilizing the retry check bit in the flash controller F-CNT will be explained with reference to the flowchart of FIG. 9 and timing charts of FIG. 10 to FIG. 14.

Figure 9:
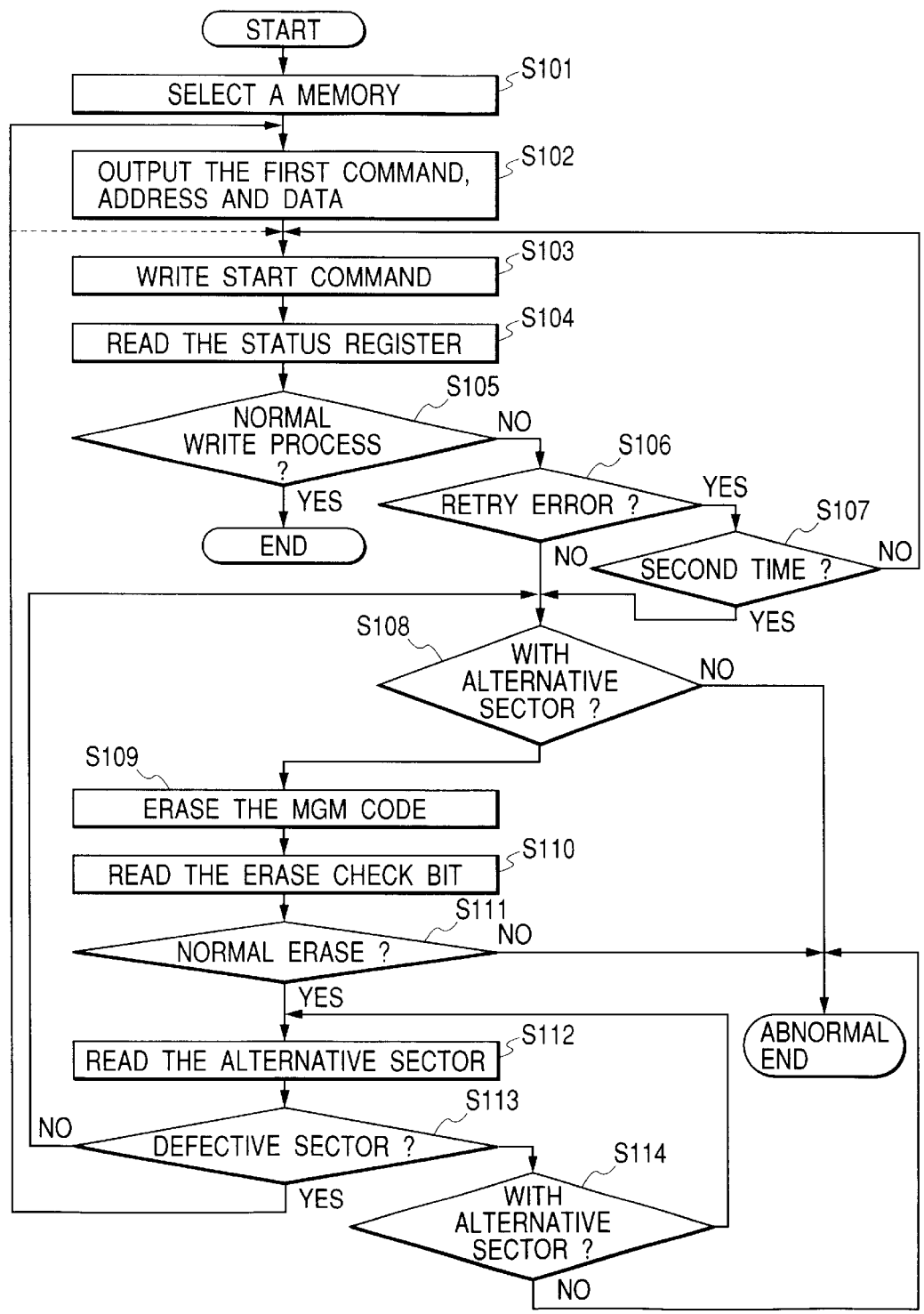
FIG. 9 is a flowchart showing an example of the practical sequence of write control in the process to write data into the flash memory with a flash memory controller in the memory system of FIG. 8.

The write control depending on the flowchart of FIG. 9 may be started when the write instruction is inputted to the flash controller F-CNT from the host CPU. When the write control is started, the flash controller F-CNT asserts any one of the chip enable signals CE1 to CE3 corresponding to each chip to the low level as the selection in order to select one of the three flash memories FLM1 to FLM3 of FIG. 8 (step S101 of FIG. 9 and timing t1 of FIG. 10).

Figure 10:
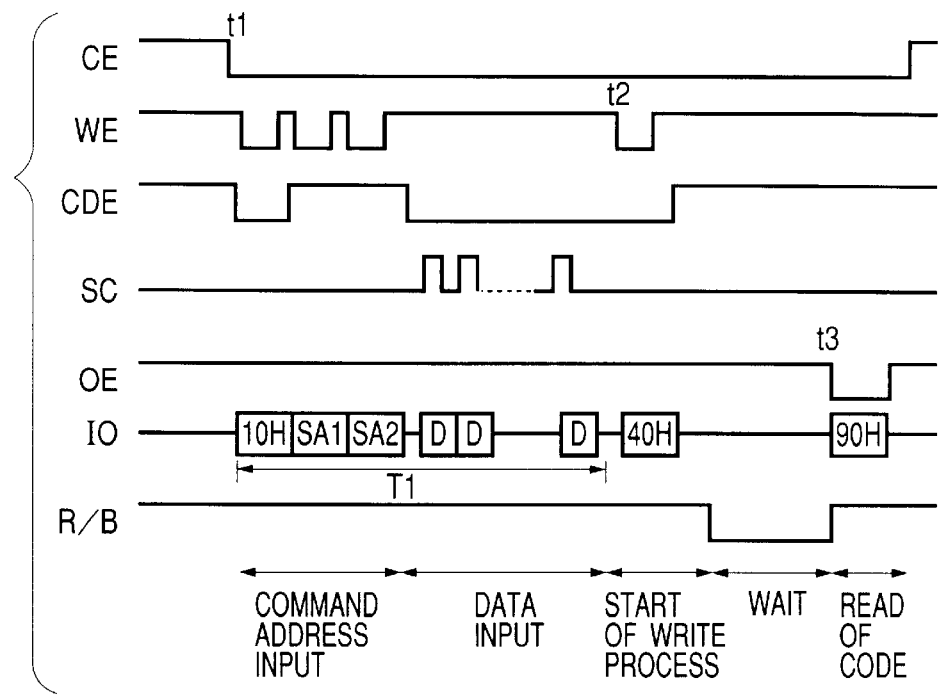
FIG. 10 is a timing chart showing the timings of signals on the occasion of inputting a write instruction to the flash memory with the flash controller.

Next, the first command (10H), write addresses (SA1, SA2) and write data (D1, D2, . . . , Dn) are generated and are then sequentially outputted on the bus BUS and a write enable signal WE indicating the write process and a command enable signal CDE indicating the command or address are also outputted in parallel (step S102 of FIG. 9, period T1 of FIG. 10). Thereafter, the write enable signal WE falls and the write start command (40H) is outputted (step S10 of FIG. 9, timing t2 of FIG. 10). Thereby, the write process is executed depending on the flowchart of FIG. 5 or FIG. 7 in the selected flash memory.

The flash controller F-CNT asserts, after output of the write start command, for example, after waiting for the predetermined time by driving a built-in timer, any one of CE1 to CE3 in the out enable signals OE1 to 0E3 to the low level as the selection level for reading the status register. However, the command enable signal CDE is maintained at the high level (step S104 of FIG. 9 and timing t3 of FIG. 10).

Since the flash memory used in this preferred embodiment is structured, as shown in FIG. 4, so that the contents of the status register are outputted from the input/output terminal I/O only by asserting the chip enable signal CE and out enable signal OE to the low level, the code of status register can be read with the signal as shown in FIG. 10. Whether the write process has been completed normally or not is determined by checking the write check bit B4 of the code read out. When the write process is completed normally, the process is closed (step S105).

Here, it is also possible, in place of waiting for the end of write process in the flash memory using the timer, that the ready/busy signal R/B outputted from the flash memory is periodically read to read the status register when busy condition changes to the ready condition or to read the status register periodically. Moreover, in the step S104, the entire part of status register is read but it is also possible to read only the write check bit B4.

Figure 11:
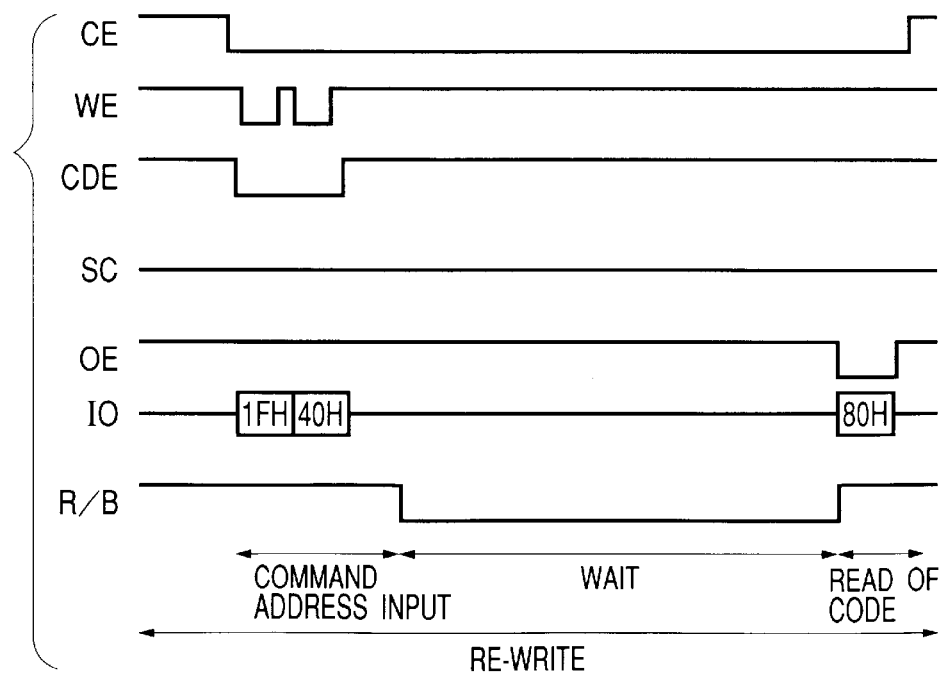
FIG. 11 is a timing chart showing the timings of signals on the occasion of inputting a re-write instruction to the flash memory with the flash controller.
Figure 12:
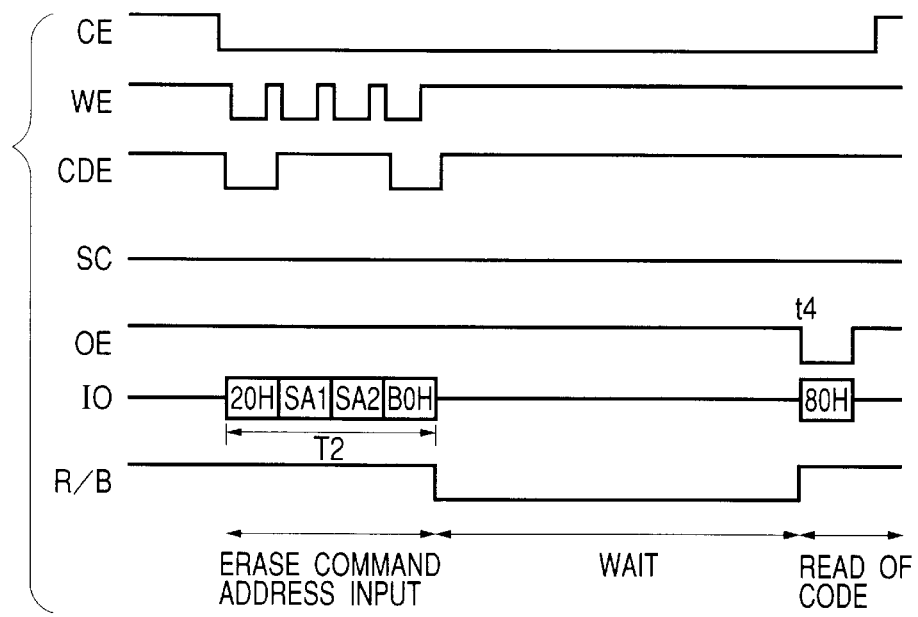
FIG. 12 is a timing chart showing the timings of signals on the occasion of inputting an erase instruction for the data (MGM code) written in the management area of the flash memory with the flash controller.

When it is determined in the step S105 that the process is completed abnormally, the process shifts to the steps S106 and whether the retry condition is set or not is determined by checking the retry check bit B6 of the status register read in the step S104. When the retry condition is set, it is determined in the step S107 whether it is the second setting or not. When the setting is not the second setting, namely when it is the first setting, the process returns to the step S103. Thereafter, the write start command is sent again to the flash memory to conduct the retry of the write operation (refer to FIG. 11). As is shown in FIG. 11, since the write address and write data are already transmitted at the time of retry of write operation, the command (1FH) instructing the use of the preceding address and data and the write start command (40H) are transmitted to the selected flash memory from the flash controller F-CNT.

When it is determined in the step S106 that the retry condition is not set or when the second retry condition is determined in the step S107, the process shifts to the step S108. In the step S108, whether there is an alternative sector or not is determined by checking the MGM table for sector management. When there is no alternative sector, the process is completed assuming that a fault is generated. When there is an alternative sector, the MGM table is updated and the erase command (20H) and the address indicting the sector to conduct the first write process are transmitted to the flash memory in order to erase the data (MGM data) indicating whether the sector is good one written in the management area or not (step S109 of FIG. 9, period T2 of FIG. 12). After waiting for the predetermined time by activating the internal timer, the command for reading the erase check bit B5 of the status register (80 H) is outputted to read the erase check bit B5 (step S110 of FIG. 9, timing t4 of FIG. 12). Thereafter, whether erase process is completed normally or not is determined by checking the bits read out. If the data is not erased normally, the process is completed abnormally assuming a fault is generated (step S111)

Figure 13:
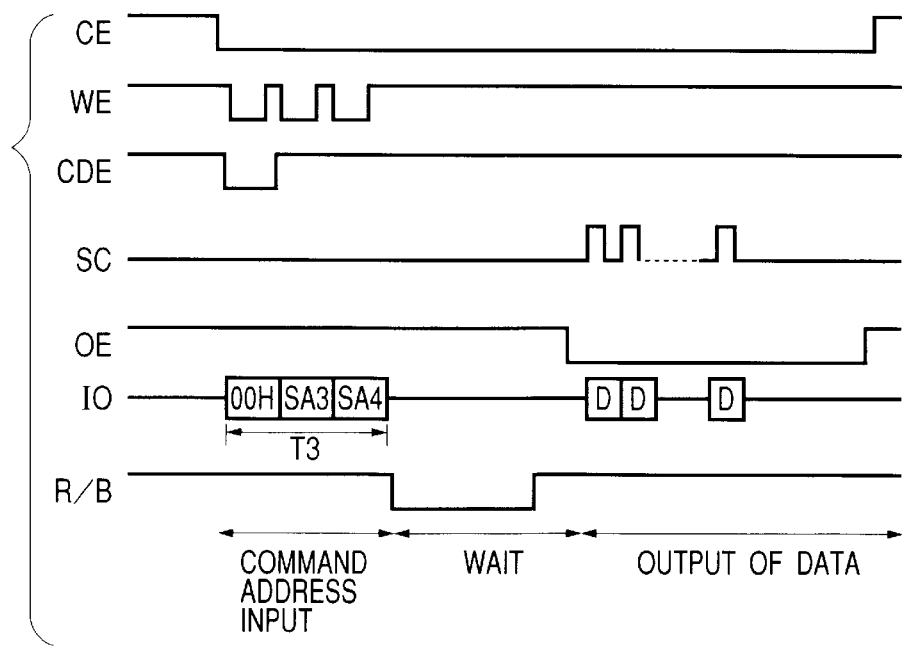
FIG. 13 is a timing chart showing the timings of signals on the occasion of inputting a read instruction for the data written in the management area of the flash memory of the flash controller.

On the other hand, when the erase process is completed normally in the step S111, the process shifts to the step S112 in which any one corresponding to the CE1 to CE3 in the out enable signals OE1 to OE3 is asserted to the low level as the selection level to output the read command (00H) of sector data and address (period T3 of FIG. 13). After waiting for the predetermined time, whether the sector is good or not is determined by checking the MGM code of the sector read out in the next step S113.

Figure 14:
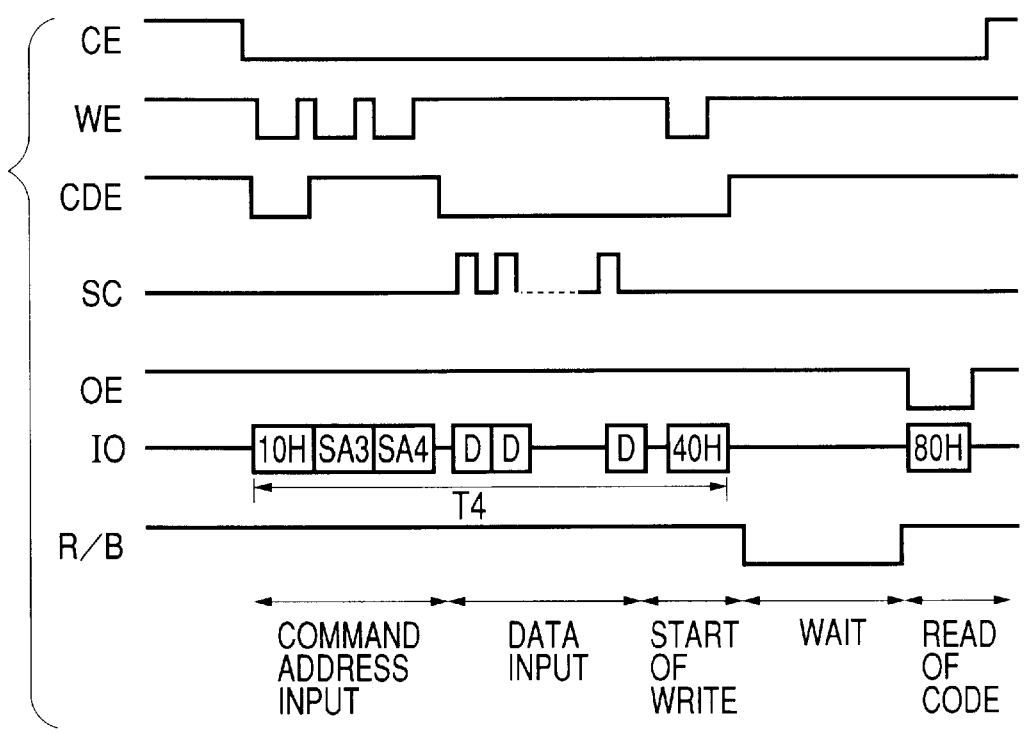
FIG. 14 is a timing chart showing the timings of signals on the occasion of inputting a write instruction of data to the management area of an alternative sector of the flash memory with the flash controller.

When the sector is good one, the process returns to the step S102 to output the first command (10H), write addresses (SA1, SA2) and write data (D1, D2, . . . , Dn) and send the write start command to the flash memory in order to write the data to the relevant alternative sector (period T4 of FIG. 14). Moreover, when the MGM code indicates the defective sector in the step S113, the process shifts to the step S114 to determine whether there is an alternative sector or not. When there is an alternative sector, the process returns to the step S112 to repeat the process. Moreover, when there is no alternative sector, the process is completed abnormally assuming that a fault is generated.

At the time of writing data to the alternative sector, the address is already sent for read operation of alternative sector in the step S112 and the write data is also sent in the step S102, it is also possible that the process is returned to the step S103 from the step S113. Otherwise, it is also possible that the alternative sector address is not transmitted when the process returns to the step S102 and only the predetermined write command and write data are transmitted.

Figure 15A:
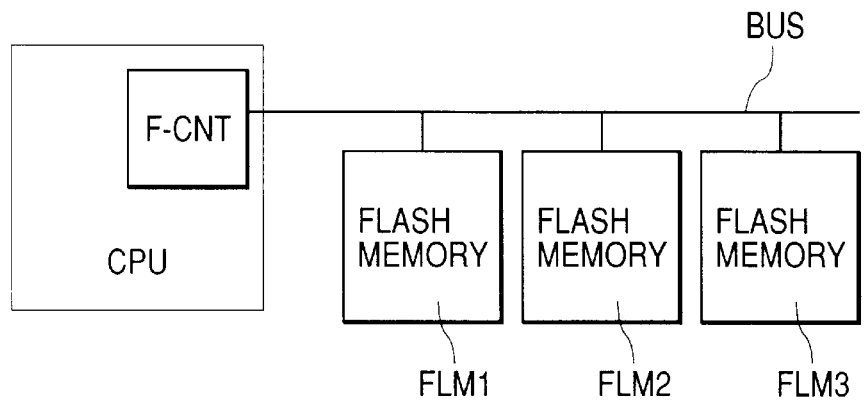
FIGS. 15(A), 15(B) and 15(C) are block diagrams showing other embodiments of the memory system of the present invention using the flash memory.
Figure 15B:
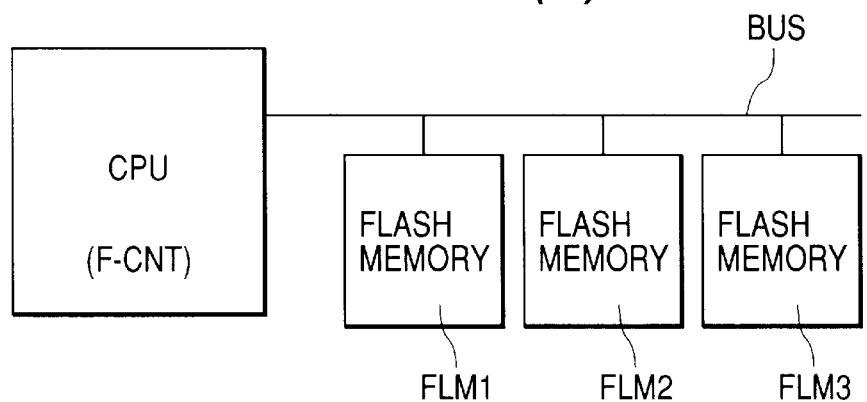
Figure 15C:
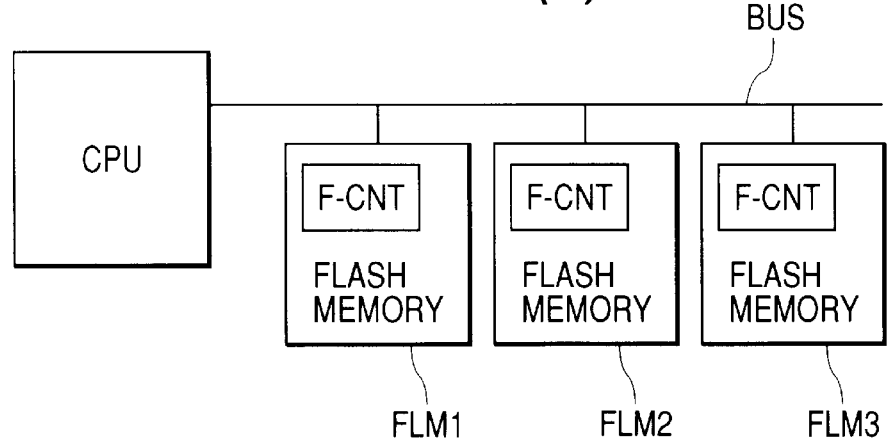

FIGS. 15(A), 15(B) and 15(C) respectively show other embodiments of the memory system utilizing the flash memory explained above. FIG. 15(A) shows a system example where the flash controller F-CNT shown in FIG. 8 is formed on the same chip as the semiconductor chip in which the CPU is formed. FIG. 15(B) shows a system example where the CPU realizes the function of the flash controller F-CNT with a software. FIG. 15(C) shows a system example where the flash controller F-CNT and flash memory FLM shown in FIG. 8 are formed on the same semiconductor chip.

Even in these system examples, the number of effective sectors can be increased by utilizing the retry check bit of the status register in the flash memory in order to prevent a reduction of memory capacity and moreover the total write operation time can be shortened by reducing the processes required for management of alternative sectors.

The present inventions has been explained practically with reference to the preferred embodiments thereof but the present invention is not limited only to such preferred embodiments and allows various changes and modifications within the scope of the claims thereof. For example, in the illustrative embodiments, threshold voltages of the memory cells are lowered with the erase operation and raised with the write operation, but the present invention can be adapted also to a flash memory system in which the threshold voltages of memory cells are raised with the erase operation and lowered with the write operation.

Also in the above description, the contents of status register 32 are outputted to the input/output terminals I/O0 to I/O7 depending on the conditions of the chip enable signal CE and out enable signal OE of the controls signals inputted to the flash memory from an external circuit, but it is also possible to provide the structure so that the outputs may be provided through combination of the other control signals, the contents of the status register are always outputted from the input/output terminals I/O0 to I/O7 when the ready/busy signal R/B is in the high level indicating the ready condition and the contents of status register are read by assigning the address to the status address and by providing the decoder to give address from an external circuit.

Moreover, a system utilizing a flash memory which is structured to utilize the FN tunnel phenomenon respectively for the write and erase operations to the memory element having the floating gate has been explained, but the present invention can also be adapted to the system utilizing the flash memory to conduct the write operation by using hot electrons generated when a drain current flows and to conduct the erase operation by using the FN tunnel phenomenon.

In above explanation, the present invention has been exemplified in a system utilizing flash memory, which addresses the application field mentioned in the background thereof, but the present invention is not limited thereto and can be applied generally to a system utilizing a non-volatile semiconductor memory for storing information by changing threshold voltages through application of the a voltage.

According to the present invention, in the system utilizing a non-volatile semiconductor memory device such as a flash memory which can electrically erase and write data, it is possible to prevent reduction of effective memory capacity due to the occurrence of an accidental write error, to increase the memory capacity for use as a system, to reduce the number of times of the alternative sector processes and to shorten the predetermined total write time.

What is claimed is:

1. A memory system comprising:
   a non-volatile semiconductor memory device including a memory section having a plurality of non-volatile memory cells, a status register indicating an internal condition of the memory device, and an external terminal for outputting at least a part of contents of said status register; and
   a controller external to said memory device and connected to said external terminal, and which issues an instruction for a write process, with information specifying an area of said memory section, to said non-volatile semiconductor memory device and which performs management of a defective write area,
   wherein said status register includes a first bit indicating whether it is possible that a normal write process can be conducted in said specified area by executing again the write process after erasing data stored in memory cells of said specified area, and
   wherein said controller is operative to issue the write instruction again for said specified area according to a condition of said first bit.

2. A memory system according to claim 1, wherein said status register includes a second bit indicating whether the write process has been completed normally, and said controller issues again the write process instruction according to the condition of said first bit when said second bit indicates that the write process has not been completed normally.

3. A memory system according to claim 2, wherein said controller has a function to replace a memory area where said write process cannot be completed normally therein, and said memory area where the write process cannot be completed normally is replaced with another memory area when the write process is not completed normally with a retry based on that said first bit is set to the first condition and when said second bit indicates that the write process is not completed normally and the said first bit is in the second condition.

4. A memory system according to claim 3, wherein said controller writes, on the occasion of replacing the memory area where the write process is not completed normally with another memory area, information indicating the defective memory area to a part of the memory area where the write process is not completed normally.

5. A memory system according to claim 4, wherein said controller reads, on the occasion of replacing the memory area where said write process is not completed normally with another memory area, information stored in said other memory area to determine whether such area is the defective area and then carries out the replacing process.

6. A memory system according to claim 5, wherein said controller conducts the process to replace said memory area with another memory area when the write process is not completed normally after conducting the retry of the write process for predetermined number of times according to the condition of said first bit.

7. A memory system according to claim 6, wherein contents of said status register are outputted to the external terminal when a plurality of control signals supplied from said controller are combined as predetermined.

8. A memory system according to claim 1, wherein said status register includes a third bit indicating whether an access from the outside of a chip is possible or not and said controller issues again the write process instruction according to the condition of said first bit when said third bit indicates that an access from the outside is possible.

9. A memory system according to claim 1, wherein said status register includes a bit indicating whether an access from the outside of a chip is possible or not, said non-volatile semiconductor memory device is provided with an external terminal reflecting the condition of said access indicating bit and said controller issues again the write process instruction according to the condition of said first bit when the signal of said external terminal indicates that access from outside is possible.

10. A memory system according to claim 1, wherein said controller has a function to replace a memory area where said write process cannot be completed normally therein, and when the write process is not completed normally therein with a retry of the write process based on the condition of said first bit, the memory area where the write process cannot be completed normally is replaced with another memory area.

11. A data processing system comprising:
    a non-volatile semiconductor memory device including a memory section having a plurality of non-volatile memory cells, a status register indicating an internal condition of the memory device and an external terminal for outputting at least a part of contents of said status register; and
    a controller external to said memory device and connected to said external terminal, and which makes accesses to said non-volatile semiconductor memory device, which accesses include write access for writing data to specified memory cells in said memory section after erasing data stored in the specified memory cells,
    wherein said status register includes a first bit indicating whether the write access can be completed normally by again making the write access, and wherein said controller is operative to make the write access again to the specified memory cells according to a condition of said first bit.

12. A data processing system comprising:
    a memory device including a non-volatile semiconductor memory circuit provided with a memory section having a plurality of non-volatile memory cells, a status register indicating an internal condition and an external terminal for outputting at least a part of contents of said status register, and a control circuit external to said non-volatile semiconductor memory circuit and connected to said external terminal thereof, said control circuit making write accesses to said non-volatile semiconductor memory circuit and conducting a process to a defective write area, said write accesses including write access for writing data to specified memory cells in said memory section; and
    a data processing device which issues access instructions to said control circuit of said memory device,
    wherein said status register includes a first bit indicating whether the write access can be completed normally by again making the write access after erasing data stored in the specified memory cells, and wherein said control circuit makes the write access again to the specified memory cells according to a condition of said first bit after erasing data stored in the specified cells.

13. A semiconductor memory system comprising:
    a non-volatile semiconductor memory; and
    a controller external to said non-volatile semiconductor memory and which controls accesses to said non-volatile semiconductor memory, wherein said non-volatile semiconductor memory includes a plurality of memory cells to and is capable of outputting to said controller an indication of an internal condition of the non-volatile semiconductor memory cells in relation to whether said memory cells are capable of writing data after erasing data stored in said memory cells, and wherein said controller operates to instruct again a write access to said memory cells when the indicated internal condition of said non-volatile semiconductor memory is a first condition and to prohibit the write access to said memory cells when the indicated internal condition of said non-volatile semiconductor memory is a second condition.

14. A semiconductor memory system according to claim 13, wherein said non-volatile semiconductor memory utilizes a memory cell structure including an MOS transistor structure having a floating gate to store data by utilizing differences of the threshold voltages generated from differences in amount of charges accumulated in said floating gate, and wherein said first condition is a condition where the charges are accumulated exceeding an amount of charges to be accumulated corresponding to data to be stored in the floating gate.

15. A semiconductor system according to claim 14, wherein said second condition is a condition where control is executed to make an alternative access to other memory cells when an access cannot be executed to specified memory cells.

16. A semiconductor system according to claim 15, wherein data to be stored in individual memory cells can be expressed as binary data of one bit.

17. A semiconductor system according to claim 15, wherein the data to be stored in individual memory cells can be expressed as binary data of 2 or more bits.

18. A semiconductor system comprising:

a non-volatile semiconductor memory; and a controller external to said non-volatile semiconductor memory and which controls accesses to said non-volatile semiconductor memory, wherein said non-volatile semiconductor memory includes a plurality of memory cells, each of which is formed respectively with an MOS transistor structure having a floating gate, generates changes of threshold voltages when charges are accumulated or extracted to or from the floating gate, stores data by utilizing differences of the threshold voltages and outputs an internal condition in relation to accumulation and extraction of charges to and from said floating gate, wherein said internal condition includes first condition indicating charges accumulated or extracted to or from said floating gate exceeding amount corresponding to data to be stored, and wherein said controller is operative to instruct again the accumulation or extraction charges to or from specified memory cells after changing threshold voltages thereof to an erased level when the internal condition of said non-volatile semiconductor memory indicates said first condition.

19. A semiconductor system according to claim 18, wherein data to be stored in individual memory cells can be expressed as binary data of one bit.

20. A semiconductor system according to claim 18, wherein data to be stored in individual memory cells can be expressed as binary data of 2 or more bits.

* * * * *